United States Patent
Barth, Jr. et al.

(10) Patent No.: US 10,650,906 B2
(45) Date of Patent: May 12, 2020

(54) MEMORY BYPASS FUNCTION FOR A MEMORY

(71) Applicant: Synopsys, Inc., Mountain View, CA (US)

(72) Inventors: John Edward Barth, Jr., Williston, VT (US); Kevin W. Gorman, Essex, VT (US); Harold Pilo, Underhill, VT (US)

(73) Assignee: Synopsys, Inc., Mountain View, CA (US)

( * ) Notice: Subject to any disclaimer, the term of this patent is extended or adjusted under 35 U.S.C. 154(b) by 29 days.

(21) Appl. No.: 16/059,477

(22) Filed: Aug. 9, 2018

(65) Prior Publication Data

US 2020/0051658 A1 Feb. 13, 2020

(51) Int. Cl.
| | |
|---|---|
| G11C 7/00 | (2006.01) |
| G11C 29/00 | (2006.01) |
| G11C 29/14 | (2006.01) |
| G11C 29/36 | (2006.01) |
| G11C 7/18 | (2006.01) |
| G11C 29/12 | (2006.01) |
| G11C 11/419 | (2006.01) |

(52) U.S. Cl.
CPC ............... *G11C 29/14* (2013.01); *G11C 7/18* (2013.01); *G11C 11/419* (2013.01); *G11C 29/1201* (2013.01); *G11C 29/12015* (2013.01); *G11C 29/36* (2013.01)

(58) Field of Classification Search
CPC ........... G11C 29/14; G11C 29/1201; G11C 29/12015; G11C 11/419
See application file for complete search history.

(56) References Cited

U.S. PATENT DOCUMENTS

| | | | |
|---|---|---|---|
| 5,440,516 A | 8/1995 | Slemmer | |
| 5,612,916 A | 3/1997 | Neduva | |
| 6,208,572 B1 | 3/2001 | Adams et al. | |
| 7,558,138 B1 | 7/2009 | Ehrenreich et al. | |
| 7,577,885 B2* | 8/2009 | Hasegawa | G11C 29/54 365/201 |
| 8,917,566 B2* | 12/2014 | Cummings | G11C 29/56004 365/194 |
| 2004/0128604 A1* | 7/2004 | Guettaf | G11C 29/02 714/741 |
| 2006/0253663 A1 | 11/2006 | Johnson et al. | |
| 2010/0037109 A1* | 2/2010 | Nadeau-Dostie | G11C 29/50 714/719 |
| 2012/0198294 A1* | 8/2012 | Nadeau-Dostie | G11C 29/1201 714/719 |
| 2018/0068714 A1* | 3/2018 | Liang | G11C 11/418 |

* cited by examiner

*Primary Examiner* — Toan K Le
(74) *Attorney, Agent, or Firm* — Fenwick & West LLP

(57) ABSTRACT

A memory bypass circuit for a memory device comprises: a word line disable circuit; a read and write activation circuit; an internal clock generator; and a write data input circuit. The word line disable circuit is coupled to a word line of the memory device for disabling a write function to the word line. The read and write activation circuit is coupled to the memory device for reading and writing of input data. The internal clock generator is coupled to the word line disable circuit and the read/write activation circuit. The write data input circuit is coupled to a write driver of the memory device for providing write data.

21 Claims, 11 Drawing Sheets

MEMORY BYPASS FUNCTION FOR A MEMORY

FIELD OF INVENTION

The present disclosure relates to methods, circuits, and systems for testing a memory device and, in particular, to a memory bypass function for the memory device.

BACKGROUND

A typical semiconductor random access memory device (e.g., a static random-access memory ("SRAM"), includes word lines, bit lines, and a memory array of cells with cell latches and pass devices connected at intersections between the word lines and the bit lines. The pass devices of the memory cells are connected to the bit lines. During a read or write operation, the bit lines allow the contents of the memory cell to be successfully read from or written into a cell latch by activating a particular word line coupled to the cell latch.

In order to test the memory device, a memory array bypass function is required to enable testing of upstream and downstream logic paths to and from the memory device without accessing the memory contents in the memory array. Array bypass logic can take data input D and propagate that data D to a data output Q without having to be written to the memory array.

FIG. 1 illustrates a prior art memory device having an asynchronous write-through circuitry for testing the memory device. A memory device of the prior art comprises a bitcell array 40, a write-driver 42, AND gates 44 and 46, an inverter 48, latches 50 and 54, a sense amplifier 52, and a multiplexer 56. The bit cell array 40 can have memory cells that have word lines which can be activated by a word line signal. The word lines can be further coupled to the bit lines for writing to the word lines or reading from the word lines. For instance, a data input D can be written to the bit cell array 40 by being stored at the latch 50 and then propagated to the bit lines via the inverter 48, the AND gates 44 and 46, and the write driver 42. A data output Q can be read back by sensing a current or voltage level of the bit lines by the sense amplifier 52. The sensed current or voltage can then be stored by the latch 54 for output.

The multiplexer 56 can serve as a logic bypass so that testing can be performed without having to write or read to the bit cell array 40. For instance, if a logic_test signal indicates that a test mode is activated, then the inputted test data D can be selected by the multiplexer 56 for output as the data output Q. If the logic_test signal does not indicate that a test mode is activated, then the multiplexer 56 can select the output from the latch 54 during a read function as the data output Q. Thus, the multiplexer 56 is inserted into the data output Q path to bypass the bitcell array 40 and asynchronously forward the inputted data D to the data output Q. The problem with such configuration is access time is not comparable to an actual read function of the memory device. Thus, timing of the data output Q from the data input D is independent of access time and does not provide an "at-speed" condition for testing of the downstream logic. Also, the use of a multiplexer for creating the data pass through creates an area penalty for implementing the multiplexer.

FIG. 2 illustrates a prior art memory device having a clocked write-through circuitry for testing the memory device. In order to address the access time, the sense amplifier 52's output can be coupled to a multiplexer 58 for selection to the latch 54. Another input of the multiplexer 58 can be coupled to the data signal D_T which is generated by the AND gate 44 for writing. The Logic_test signal can be used to select one of the inputs of the multiplexer 58 for output to the latch 54. The multiplexer 58 is thus added in the data output Q path to bypass the bitcell array 40 and synchronously forward the input data D to the data output Q. The drawback of such approach is that the downstream latch 54 is required to time the transition of the Q output appropriately. The use of the multiplexer 58 also still incurs some access time inaccuracy and area penalty in implementation of the multiplexer 58. Such solution provides for a nearly at-speed logic test attribute, but with performance and area overhead issues.

Therefore, there exists a need for an at-speed memory bypass function for a memory to handle test modes.

DESCRIPTION OF THE DRAWINGS

The following detailed description together with the accompanying drawings in which the same reference numerals are sometimes used in multiple figures to designate similar or identical structural elements, provide a better understanding of the nature and advantages of the present disclosure.

DETAILED DESCRIPTION

Figure 1:
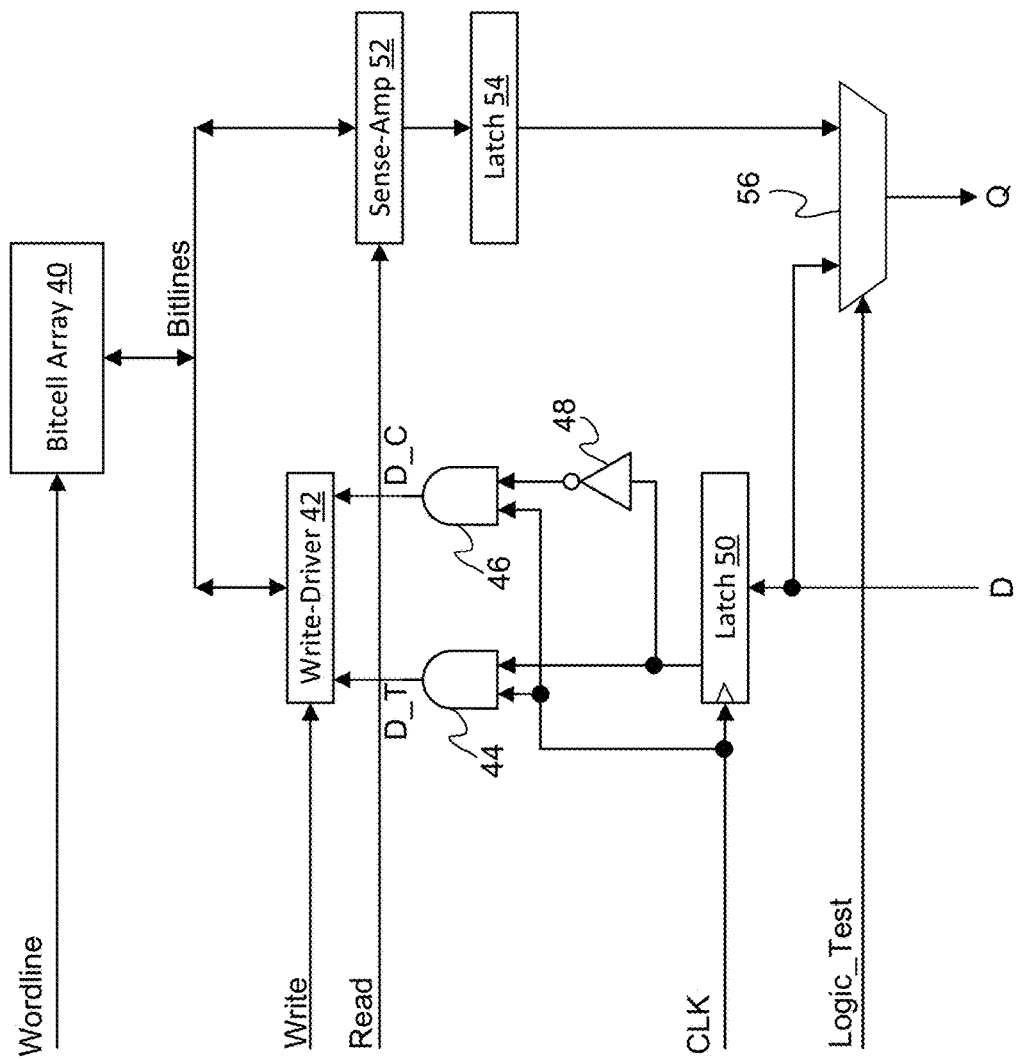
FIG. 1 illustrates a prior art memory device having an asynchronous write-through circuitry for testing the memory device.
Figure 2:
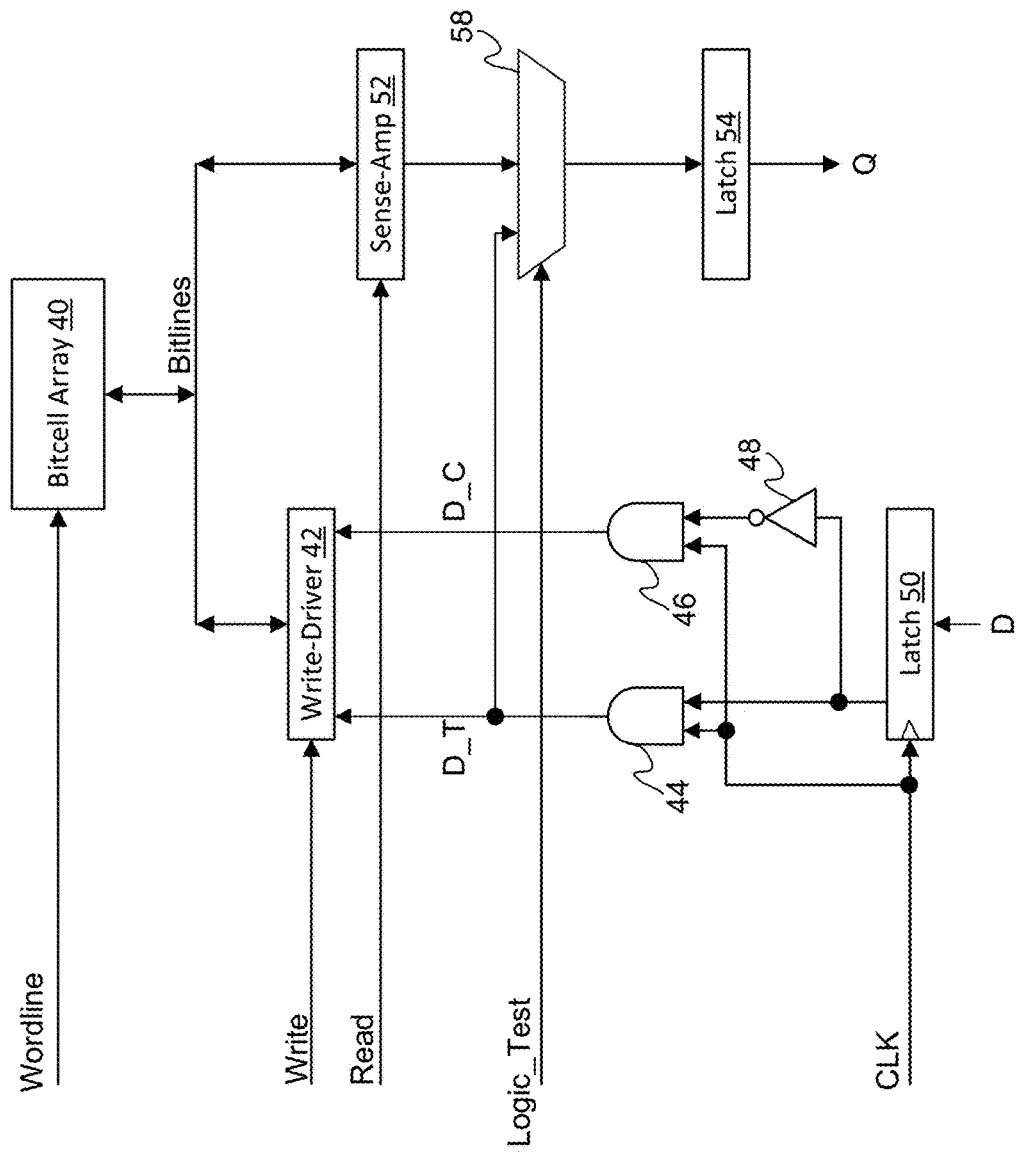
FIG. 2 illustrates a prior art memory device having a clocked write-through circuitry for testing the memory device.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the invention. However, it will be apparent that various embodiments may be practiced without these specific details. The figures and description are not intended to be restrictive.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the claims section.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but it may have additional steps not included in the present disclosure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk ("CD") or digital versatile disk ("DVD"), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

Figure 3:
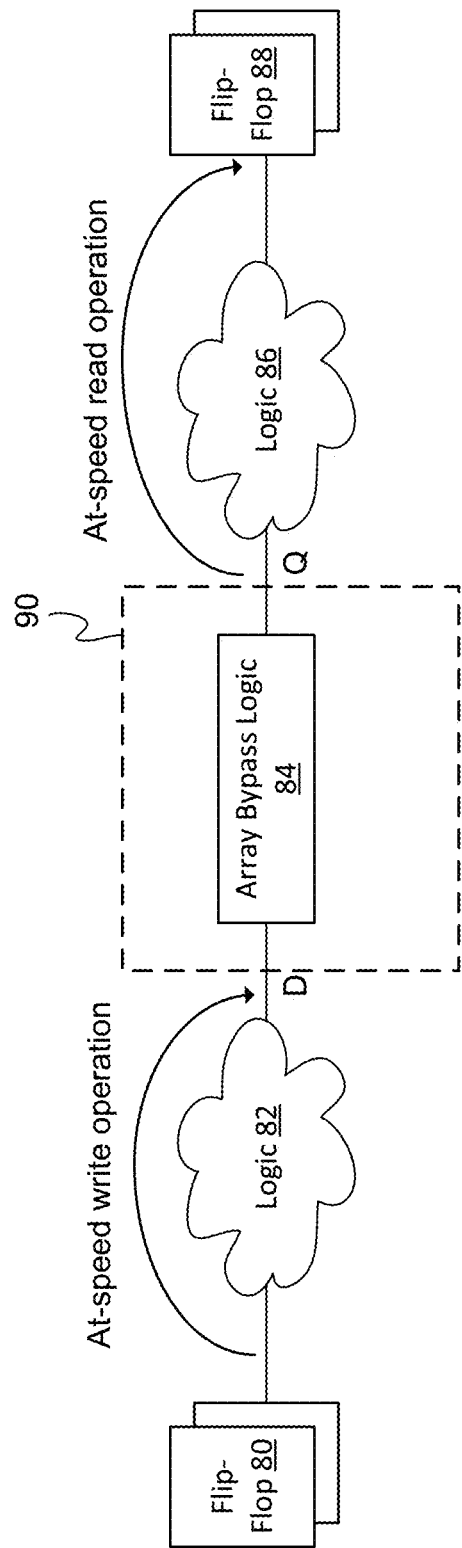
FIG. 3 illustrates a high level diagram for at-speed write and read operations of a memory bypass function.

Reference is now made to the figures of the present disclosure. FIG. 3 illustrates a high-level diagram for at-speed write and read operations for a memory device. When testing the logic for the at-speed write operation and the logic for the at-speed read operation, the memory 90 may have an array bypass logic 84 for taking data input D from a logic path 82 and write that data input D into a data output Q to a logic path 86 for an at-speed read operation. A flip-flop 80 can be coupled to the logic path 82 for generating the data input D. Likewise, a flip-flop 88 can be coupled to the logic path 86 for receiving the read information.

An array bypass logic 84 of the memory device 90 can be used to make such transfer of data without having to write or read from the memory array 90. A memory array bypass function, implemented by the array bypass logic 84, is required to enable testing of upstream and downstream logic paths 82 and 86 to and from the memory device 90 without accessing its memory contents.

In implementing such array write through functionality, it is important to note that the present disclosure enables a clocked write-through function whereby a data input D pin is outputted to a data output Q pin. The write-through function can use some existing elements in the write and read path of the memory device to enable the write-through function. As such, access time of the data output Q during a clocked write-through during testing can be equal to or substantially equal to a functional read operation, which facilitates an at-speed testing of upstream and downstream logic paths to and from the memory device. Thereby, there may be little to no access time penalty or area overhead.

The present disclosure presents a method in which concurrent write and read operations are performed to the memory array. The read and write data paths are enabled concurrently and independent of the primary inputs. A word line is forced to unselected mode to prevent writing to any memory location during the write-through operation. The local array write driver can write data to the bit lines and a sense amplifier can simultaneously be enabled to drive data from the bit lines to the data output Q. An XNOR data/bit-write function during the write-through can be enabled to support a bit-write operation as detailed below. The bit-write operation can be used to control which bits in a word get written to the memory. It can be appreciated that the XNOR gate can be an optional component.

Figure 4:
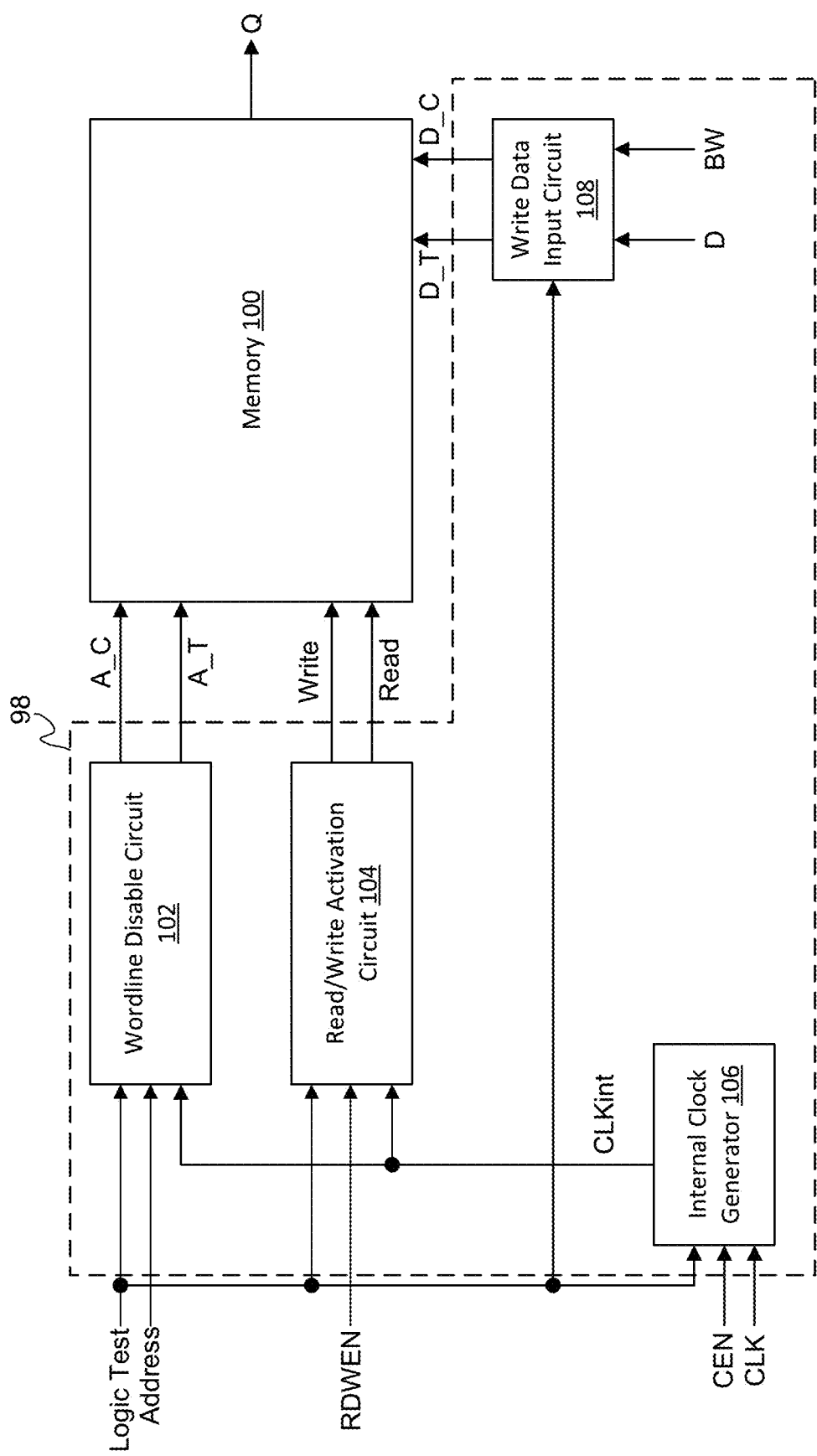
FIG. 4 illustrates a block diagram for a memory system of the present disclosure having a memory and a memory bypass circuit.

FIG. 4 illustrates a block diagram for a memory system of the present disclosure having a memory and a memory bypass circuit. A memory system of the present disclosure comprises a memory bypass circuit 98 and a memory 100. The memory bypass circuit 98 can further comprise a word line disable circuit 102, a read and write activation circuit 104, an internal clock generator 106, and a write data input circuit 108. The word line disable circuit 102 is coupled to the memory 100 for disabling activation of a word line of the memory 100. The read and write activation circuit 104 is also coupled to the memory 100 for concurrently activating reading and writing functions during a testing mode. The internal clock generator 106 is coupled to the word line disable circuit 102 and the read and write activation circuit 104 for clocking the respective circuits. The write data input circuit 108 is coupled to a write driver of the memory 100 device for providing test input data.

The word line disable circuit 102 receives a logic test signal, an address, an internal clock signal CLKint. The logic test signal can indicate when a testing mode is activated. For instance, the logic test signal can be at a logic low level (e.g., "0") to indicate that logic testing is not activated and a logic high level (e.g., "1") to indicate that the logic testing is activated.

When the logic test signal indicates that testing is activated, then the word line disable circuit 102 can take an address input and generate a differential signal A_C and A_T to disable a particular word line of the memory 100. The address can be a set of inputs that are used to decode any specific word line. For example, a 6-bit address bus can activate one of 64 word lines of the memory. Typically, the decoders of the memory are AND gate structures that use both a true signal (i.e., the A_T signal) and a complement (or inverted input) signal (i.e., the A_C signal). The combination of the A_T and A_C signals are used to decode any particular wordline. If both A_T and A_C are at a low logic level "0", then the decoder cannot be selected, preventing any word line from activating.

The disabling of the word line can prevent any data from being written to the memory and also prevent data from being read from the memory array of the memory. The word line disable circuit 102 is clocked by the internal clock signal CLKint, which is generated by the internal clock generator 106.

The read and write activation circuit 104 receives the logic test signal, the RDWEN signal, and the internal clock signal to activate the write function and/or the read function accordingly. When the logic test signal indicates that the testing mode is activated, then the read and write activation circuit 104 will provide for a concurrent read function and write function within a single clock cycle of the clock signal CLK. When the logic test signal indicates that the testing mode is not active, then the memory 100 is operated in a normal mode in which the RDWEN signal can provide for indication of whether a normal read function is activated or a normal write function is activated for the memory 100.

The internal clock generator 106 generates the internal clock signal CLKint for clocking the word line disable circuit 102 and the read and write activation circuit 104. The internal clock generator 106 receives the logic test signal, the chip enable signal CEN and the clock signal CLK as inputs. The internal clock signal CLKint can be generated to follow the clock signal CLK when (1) either the logic test signal indicates that a testing mode is activated or (2) the chip enable signal CEN is disabled. Furthermore, a programmable array-tracking timing delay can be introduced to generate the CLKint in accordance with a predefined timing delay. The purpose of the array-tracking timing delay is to provide an internal pulse of the internal clock signal CLKint with timing characteristics that allow the memory array to write and read properly.

The write data input circuit 108 can have inputs for the logic test signal, a data signal, and a bit-write signal. The bit-write signal is optional to allow for a bit-write function. For instance, an embodiment may omit the bit-write functionality and the bit-write signal from such write data input circuit such that the inputted data D can simply be passed to the memory 100 with a complementary signal, where both the inputted data D and the complementary signal can be written to the bit lines of the memory 100.

Figure 5:
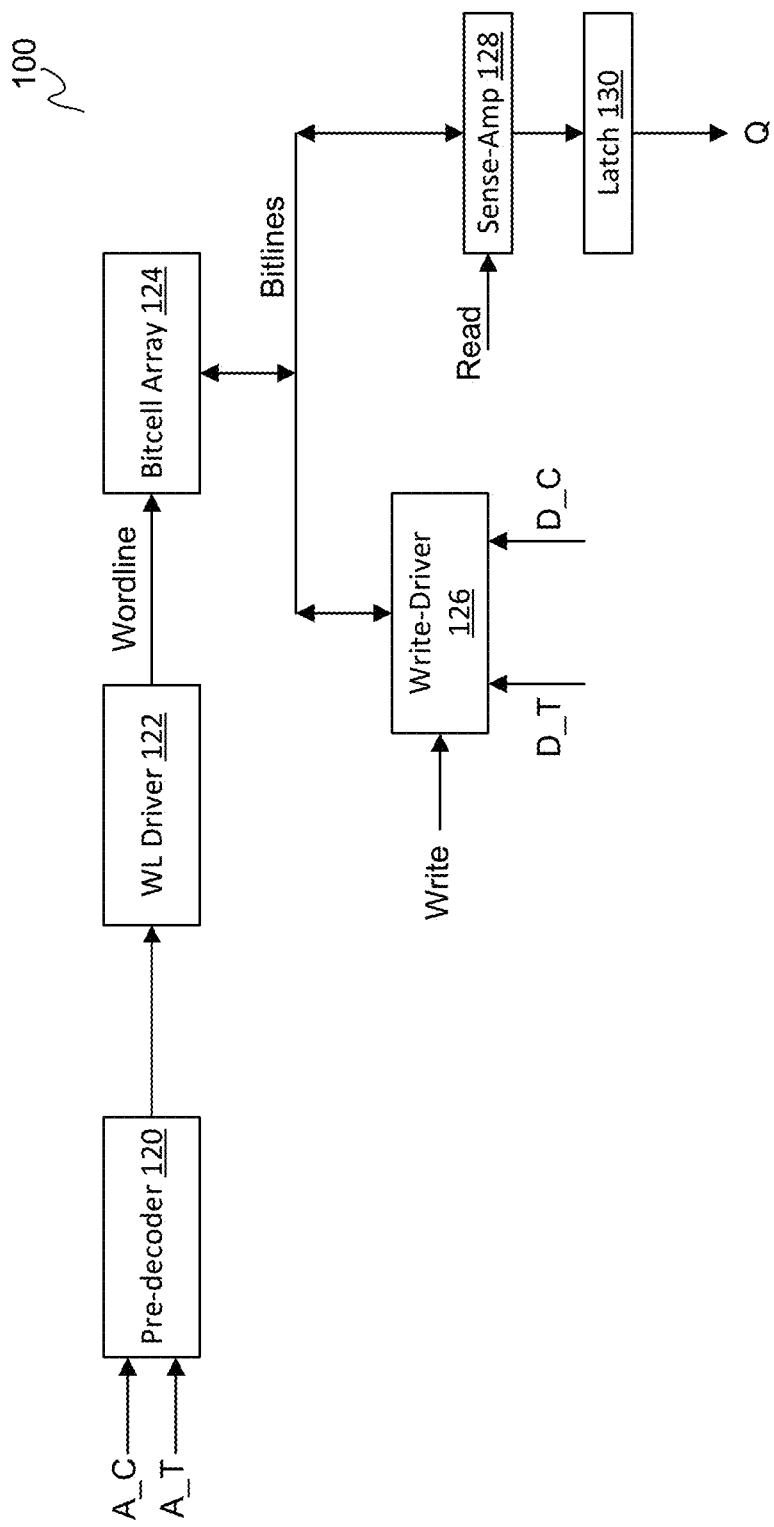
FIG. 5 illustrates a block diagram of a memory.

FIG. 5 illustrates a block diagram of a memory. The memory, e.g., a SRAM, memory 100 can comprise a pre-decoder 120, a word line ("WL") driver 122, a bitcell array 124, a write driver 126, a sense amplifier 128, and a latch 130. The pre-decoder 120 can be implemented by a NAND gate serially connected to an inverter for generating a predecoded word line output. The pre-decoder 120 can receive the differential signal A_C and A_T and decode this to disable a particular word line of the bitcell array. The output of the pre-decoder 120 can be coupled to the WL driver 122 to drive the output of the pre-decoder 120 to the bitcell array 124.

During the testing mode (e.g., when the logic test signal is at a logic high level), both of the differential signals A_C and A_T will be at a logic low which will deactivate the word line. When the testing mode is not activated (e.g., when the logic test signal is a logic low level), either of the signals A_C and A_T can be at the one state (i.e., a logic high level) to indicate that normal operation of the bitcell array 124 is selected and that a word line can be activated normally via the pre-decoder 120 and the WL driver 122. The WL driver 122 drives a particular word line based on the output of the pre-decoder 120. The bitcell array 124 comprises an array of memory cells with word lines. The memory cells can be written to or read from via the bit lines. The bit lines are further coupled to a write driver 126 for writing data to the bit lines via a differential data signal D_T and D_C based on a write command signal. The bit lines are also coupled to a sense amplifier 128 for reading data off the bit lines based on a read command signal. The read data is stored by the latch 130 for data output Q.

Figure 6:
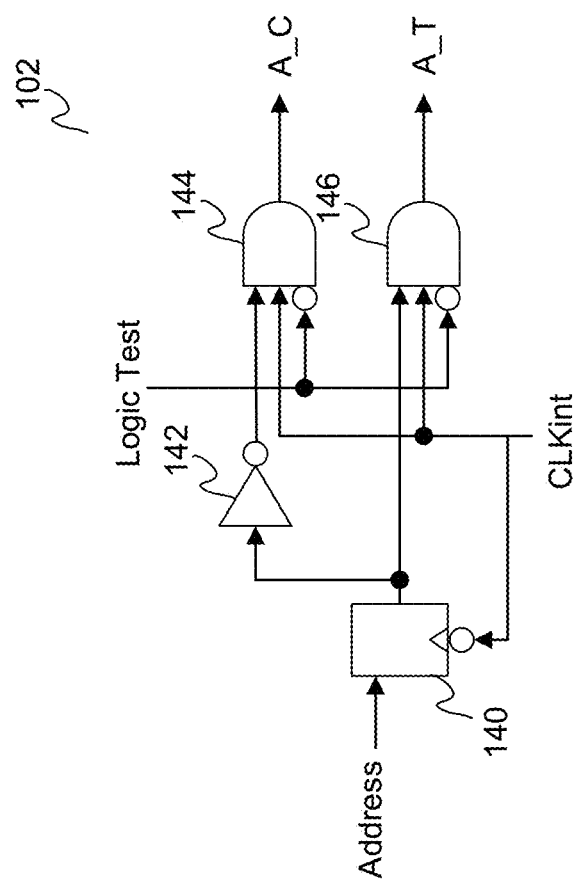
FIG. 6 illustrates a diagram of a word line disable circuit of the present disclosure.

FIG. 6 illustrates a diagram of a word line disable circuit of the present disclosure. The word line disable circuit 102 comprises a latch 140, an inverter 142, an AND gate 144 for generating a word line deactivation signal A_C based on the negated logic test signal, an output of the inverter 142, and the internal clock signal CLKint, and another AND gate 146 for generating a complementary word line deactivation signal A_T based on the negated logic test signal, the internal clock signal CLKint, and an output of the latch 140.

The data input of the latch 140 is coupled to the address. The clock input of the latch 140 is coupled to an inverse of the internal clock signal CLKint. The data output of the latch 140 is coupled to an input of the inverter 142. Thus, the AND gate 144 receives, as one of its input, the inverted output of the latch 140 via the inverter 142. The data output of the latch 140 is further coupled to an input of the AND gate 146.

As discussed earlier, the signals A_C and A_T are either complementary signals to one another or are both set to a low logic level 0. When the signals A_C and A_T are both set to a logic low level 0, then the logic test signal is at a high logic level indicating that the testing mode is activated. When the signals A_C and A_T are both set to complementary signals, then the logic test signal is set to a low logic level, indicating that testing mode is not activated, and the internal clock signal CLKint is at a high logic level 1.

Figure 7:
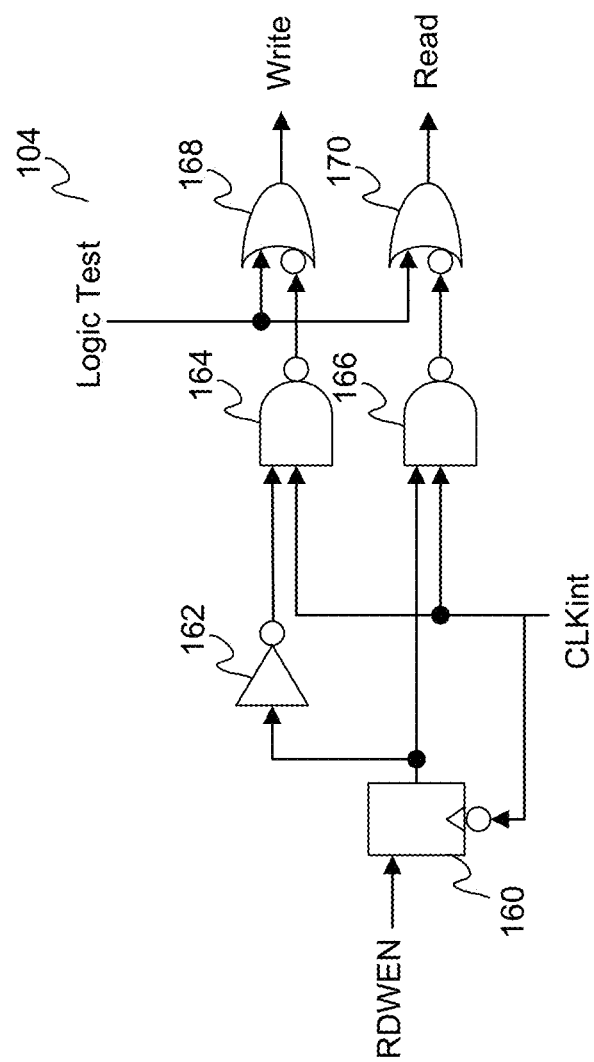
FIG. 7 illustrates a diagram of a read and write activation circuit of the present disclosure.

FIG. 7 illustrates a diagram of a read/write activation circuit of the present disclosure. The read and write activation circuit 104 comprises a latch 160, an inverter 162, NAND gates 164 and 166, an OR gate 168 for generating a write command signal, and another OR gate 170 for generating a read command signal. It can be appreciated that the read and write activation circuit 104 is an optional circuit in that the logic test signal can be directly used for reading and writing function calls to the memory 100. It can also be appreciated that the logic components in the read and write activation circuit 104 can be further interchanged with equivalent logic circuits to provide for a write function call or a read function call to the memory 100.

Referring to FIG. 7, a read/write signal RDWEN is indicative of whether a write function or a read function is called for the memory 100. For instance, when the RDWEN signal is at a low logic level, this can be indicative of a write function call. When the RDWEN signal is at a high logic level, this can be indicative of a read function call. The RDWEN signal is stored by the latch 160. The latch 160 is clocked by a negated, internal clock signal CLKint and has a data output coupled to the inverter 162 and the NAND gate 166. The inverter 162 has an output coupled to an input of the NAND gate 164. The internal clock signal CLKint is coupled to another input of the NAND gate 164 and another input of the NAND gate 166.

The OR gate 168 has two inputs, one input coupled to the logic test signal and another input coupled to a negated output of the NAND gate 164. The output of the OR gate 168 is the write command signal to the memory 100. The OR gate 170 has two inputs, one input coupled to the logic test signal and another input coupled to a negated output of the NAND gate 166. The output of the OR gate 170 is the read command signal to the memory 100.

During normal operation when testing is deactivated (e.g., the logic test signal is low), when the RDWEN signal is at a low logic level, then the write command signal is set to a high logic level and the read command signal is set to a low logic level, meaning that a write function call has been made to the memory 100. When the RDWEN signal is at a high logic level, then the write command signal is set to a low logic level and the read command signal is set to a high logic level, meaning that a read function call has been made to the memory 100.

During testing (e.g., the logic test signal is high, then both the write command signal and the read command signal are driven to a high logic level by the OR gate 168 and the OR gate 179, respectively.

Figure 8:
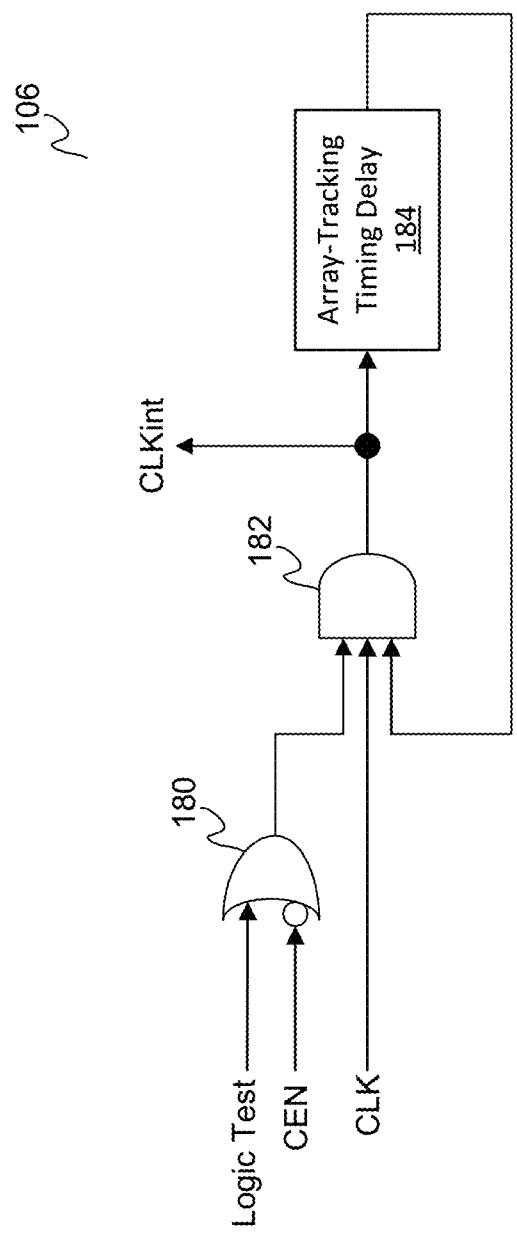
FIG. 8 illustrates a diagram of an internal clock generator of the present disclosure.

FIG. 8 illustrates a diagram of an internal clock generator of the present disclosure. The internal clock generator 106 comprises an OR gate 180, an AND gate 182, and an array-tracking timing delay 184. The logic test signal and a negated chip enable CEN signal are coupled to inputs of the OR gate 180. The chip enable CEN signal indicates that the memory is enabled for either a read or write operation. An output of the OR gate 180, the clock signal CLK, and an output of the array-tracking timing delay 184 are coupled to inputs of the AND gate 182. An output of the AND gate 182 generates the internal clock signal CLKint, which can be further applied to an input of the array-tracking timing delay 184. The internal clock signal CLKint can be used to clock the word line disable circuit 102 and the read and write activation circuit 104.

Figure 9:
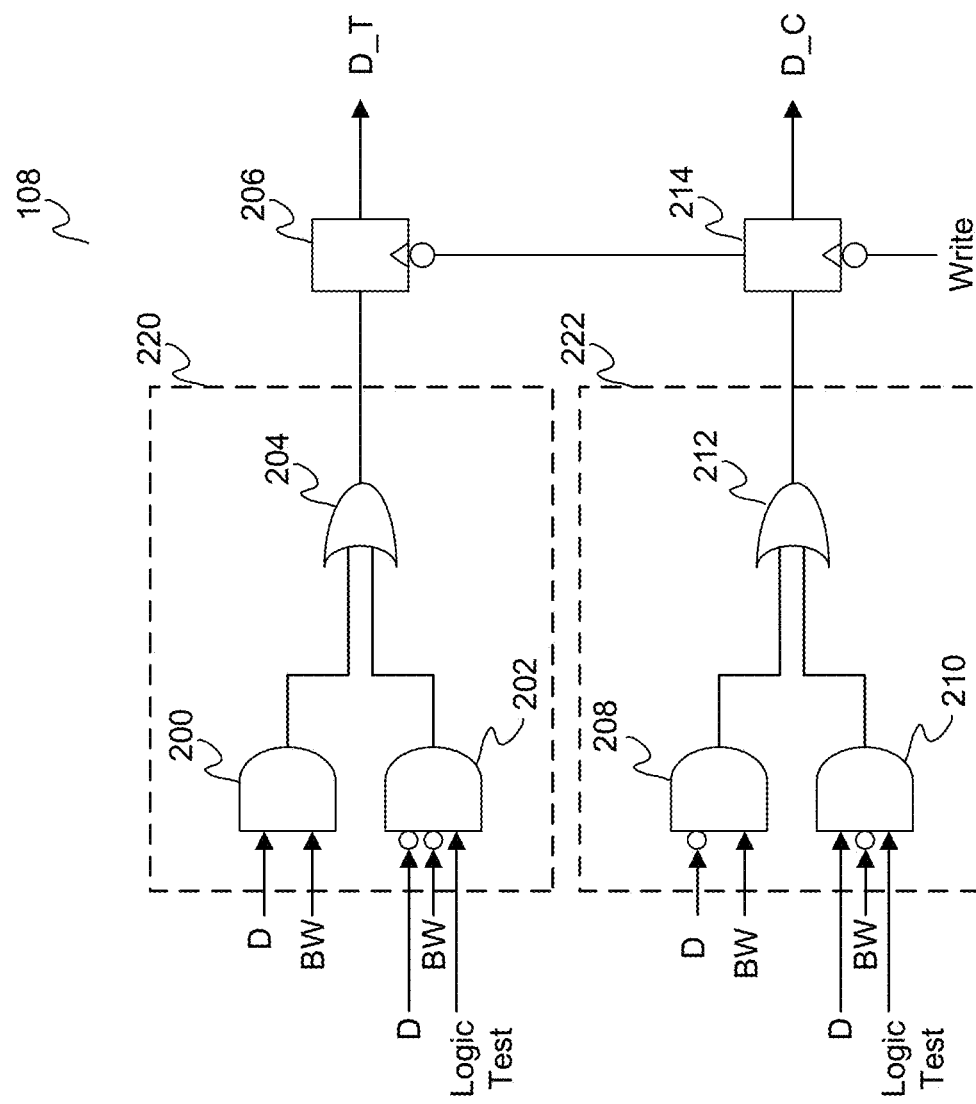
FIG. 9 illustrates a diagram of a write data input circuit of the present disclosure.

FIG. 9 illustrates a diagram of a write data input circuit of the present disclosure. The write data input circuit 108 comprises an XNOR gate 220, an XNOR gate 222, and latches 206 and 214. The XNOR gate 220 can have inputs for receiving the inputted data D, the bit-write signal BW, and the logic test signal to generate a D_T signal that is stored by the latch 206. The latch 206 can be clocked by the write command signal for storing the XNOR gate 220's output. The latch 206 has a data output to generate the D_T signal.

The XNOR gate 222 can have inputs for receiving the data signal D, the bit-write signal BW, and the logic test signal to generate a D_C signal that is stored by the latch 214. The latch 214 can be clocked by the write command signal for storing the negated XNOR gate 222's output. The latch 214 has a data output to generate the D_C signal.

The inputs of the XNOR gate 222 for the input data D can be negated relative to the inputs of the XNOR gate 220 for the input data D such that the output of the XNOR gate 222 is complementary to the output of the XNOR gate 220. Thus, the D_C signal can be the complementary signal to the D_T signal. The complementary signals D_T and D_C can then be written to the bit lines via the write driver 126 of the memory 100.

It can be appreciated that the XNOR gate 220 can be implemented by various other logic gates. For instance, in this embodiment, the XNOR gate 220 can comprise AND gates 200 and 202 and an OR gate 204. Likewise, the NOR gate 222 can be implemented by various other logic gates as well beyond the AND gates 208 and 210 and the OR gate 212. The logic gates shown herein are only for illustration and are not meant to limiting with respect to the present disclosure.

Figure 10:
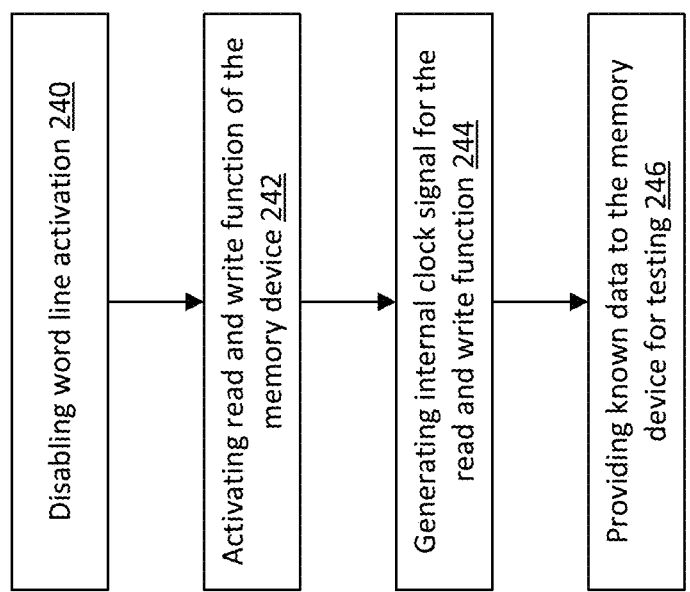
FIG. 10 illustrates a flow chart for a memory bypass function of the present disclosure.

FIG. 10 illustrates a flow chart for a memory bypass function of the present disclosure for testing of a memory device. A method for testing a memory device using a memory bypass circuit can comprise the following steps. The word line for a memory is disabled, step 240, based on a logic test activation. For instance, the word line disable circuit 102 can generate the signals A_C and A_T based on the logic test signal, the address of the word line for disabling, and the internal clock signal to disable the particular word line of the memory from activating.

Next, a read function and a write function for the memory device is concurrently activated, step 242. A read and write activation circuit or other similar logic can be used to activate both the read function and the write function of the memory device. Since the word line in the memory array is not active, the write function call can write data to the bit lines without changing any of the data stored in the memory array. The read function call can then sense the data from the bit lines.

An internal clock signal can be generated, step 244, for the concurrent read and write function activations and for disabling the word line. The internal clock signal is based on the logic test signal, the chip-enable pin of the memory device, and the clock signal for the memory device.

Known data D is provided to the memory device, step 246, for writing to the bit lines during testing. During the read function, the data written to the bit lines is read by the memory device for data output Q. The provided data D and the data output Q should be logically equivalent.

It can be appreciated that some of the steps disclosed herein can be done in parallel with each other or in a different order which may be apparent based on the details of a specific step. Thus, the order of the steps presented herein is not meant to be limiting to the present disclosure.

In an embodiment, a memory system (not shown) can comprise: one or more data processors; and a non-transitory computer readable storage medium containing instructions which, when executed by the one or more data processors, cause the one or more data processors to perform actions including: disabling word line activation of a memory device; concurrently activating read and write function calls of the memory device; generating an internal clock signal for clocking the concurrent read and write function calls; and providing known data D to the memory device during the concurrent read and write function calls.

Figure 11:
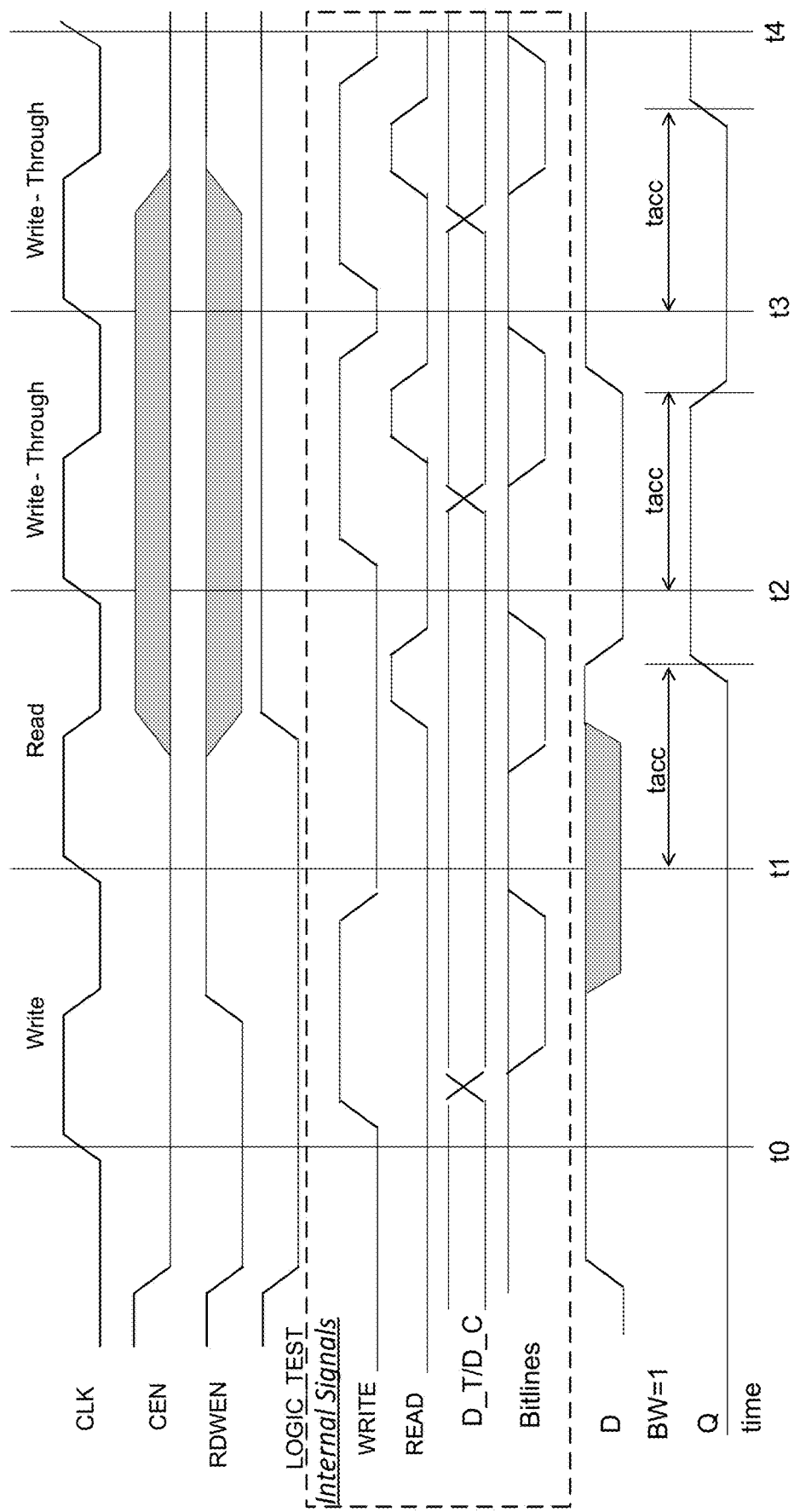
FIG. 11 illustrates a timing diagram for a memory bypass function of the present disclosure.

FIG. 11 illustrates a timing diagram for a memory bypass function of the present disclosure. The timing diagrams provides various signals for the memory device during normal operation and during a testing mode. From time t0 to t1, a normal write operation is performed by the memory device. From time t1 to t2, a normal read operation is performed. From time t2 to t3, a first write through function is performed for the testing mode, where the read and write functions are both called. From time t3 to t4, a second write through function is performed for the testing mode, where the read and write functions are called. The shaded regions for the CEN, RDWEN, and D signals indicate a "don't care state" for those respective signals at that particular time.

In the normal write function call from time t0 to t1, the logic test signal is low, indicating that testing is not activated and that the memory is undergoing normal operation. When the write signal goes to a high logic level, the bit lines are written with the D_T and D_C signals.

In the normal read function call from time t1 to t2, the logic test signal is initially low. Half way through the clock period for the read function, the logic test signal goes to a high logic level to set up a testing mode for the next period of the CLK signal. However, since the logic test signal was initially at a low logic level at time t1 for the read function, the memory device performs a normal read operation. When the read signal goes high, the sense amplifier senses the voltage on the bit lines for generating a data output Q. Since in the previous write function the bit lines were in a high state, the data output Q is also at a high logic level, representing the sensed stated of the bit lines.

The time between when a clock period for a respective read function starts and when a data output Q is outputted can be referred to as the access time ("tacc"). The access time between the start of the CLK period at time t1 and the time when the data output Q reaches a threshold voltage to indicate the high logic level is illustrated in FIG. 11. The access time during a normal read operation can be equal or substantially equal to the access time during the testing mode.

In the testing mode from time t2 to t3, the logic test signal is at a high logic state through this entire period of the CLK. Furthermore, the write function and the read function are both called during this period. First, the write function writes a logic low data to the bit lines. Since the word lines are disabled, writing to the bit lines does not cause any change in the memory cells of the memory. Next, the read function can read from the bit lines a low logic level and output that low logic level as the data output Q.

The access time between the start of the CLK period at time t2 and the time when the data output Q reaches a threshold voltage to indicate the low logic level of the bit lines is equal to or substantially equal to the access time in the normal read function call in time t1 to t2. Thus, the access time in the testing mode may not incur any access penalty since the access time in the testing mode is on par with the access time during a normal read operation.

Furthermore, in the testing mode from time t3 to t4, the logic test signal is at a high logic state through this entire period of the CLK. The write function and the read function are both called during this period. First, the write function writes a logic high data to the bit lines. Since the word lines are disabled, writing to the bit lines does not cause any change to the memory cells of the memory. Next, the read function can read from the bit lines the high logic level and output that level as the data output Q.

The access time between the start of the CLK period at time t3 and the time when the data output Q reaches a threshold voltage to indicate the high logic level of the bit lines is equal to or substantially equal to the access time in the normal read function call in time t1 to t2. Thus, the access time in the testing mode may not incur any access penalty since the access time in the testing mode is on par with the access time during a normal read operation.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not taught to be exhaustive or to limit the embodiments to the precise forms disclosed. Many modifications and variations are possible in view of the above teachings.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims. Furthermore, it is appreciated that the terms such as "first", "second", "third", etc. may be used to distinguish between elements such terms describe. These terms are not necessarily intended to indicate temporal or prioritization of such elements, unless otherwise explicitly stated.

As noted, the computer-readable medium may include transient media, such as a wireless broadcast or wired network transmission, or storage media (that is, non-transitory storage media), such as a hard disk, flash drive, compact disc, digital video disc, Blu-ray disc, or other computer-readable media. The computer-readable medium may be understood to include one or more computer-readable media of various forms, in various examples.

In the foregoing description, aspects of the application are described with reference to specific embodiments thereof, but those skilled in the art will recognize that the invention is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described invention may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

Where components are described as performing or being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the embodiments disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random access memory ("RAM") such as synchronous dynamic random access memory ("SDRAM"), read-only memory ("ROM"), non-volatile random access memory ("NVRAM"), electrically erasable programmable read-only memory ("EEPROM"), flash memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors ("DSPs"), general purpose microprocessors, an application specific integrated circuits ("ASICs"), field programmable logic arrays ("FPGAs"), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein. In addition, in some aspects, the functionality described herein may be provided within dedicated software modules or hardware modules configured for encoding and decoding, or incorporated in a combined encoder-decoder ("CODEC").

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

We claim:

1. A memory bypass circuit for a memory device, comprising:
    a word line disable circuit; and
    a read and write activation circuit;
    wherein the word line disable circuit is coupled to a word line of the memory device, and
    wherein the read and write activation circuit is coupled to the memory device for concurrent activation of writing and reading functions of the memory device during a testing mode.

2. The memory bypass circuit of claim 1 further comprising an internal clock generator and a write data input circuit, wherein the internal clock generator is coupled to the word line disable circuit and the read/write activation circuit, and wherein the write data input circuit is coupled to a write driver of the memory device for providing test data.

3. The memory bypass circuit of claim 1 wherein the word line disable circuit comprises:
    a latch,
    an inverter,
    a first AND gate for generating a word line deactivation signal A_C, and
    a second AND gate for generating a word line deactivation signal A_T,
    wherein inputs of the first AND gate are coupled to an output of the inverter, a negated logic test signal, and an internal clock signal, and
    wherein inputs of the second AND gate are coupled to the negated logic test signal, the internal clock signal, and an output of the latch.

4. The memory bypass circuit of claim 3 wherein an input of the latch is coupled to an address input, wherein a clock input of the latch is coupled to an inverse of the internal clock signal, and wherein the word line deactivation signal A_C and the word line deactivation signal A_T are complimentary signals.

5. The memory bypass circuit of claim 1 wherein the read and write activation circuit comprises:
    a latch,
    an inverter,
    a first NAND gate,
    a second NAND gate,
    a first OR gate for generating a write command signal, and
    a second OR gate for generating a read command signal.

6. The memory bypass circuit of claim 5 wherein a first input of the first OR gate is coupled to the logic test signal and a second input of the first OR gate is coupled to an output of the first NAND gate, and wherein a first input of the second OR gate is coupled to the logic test signal and a second input of the second OR gate is coupled to an output of the second NAND gate.

7. The memory bypass circuit of claim 6 wherein the latch, the inverter, and the first NAND gate are serially connected for generating a signal indicative of a normal write command, and wherein the latch and the second NAND gate are serially connected for generating a signal indicative of a normal read command.

8. The memory bypass circuit of claim 1 wherein the internal clock generator comprises an OR gate, an AND gate, and an array-tracking timing delay.

9. The memory bypass circuit of claim 8 wherein a logic test signal and a negated chip enable signal are coupled to the OR gate, wherein an output of the of the OR gate, a clock signal, and an output of the array-tracking timing delay are coupled to inputs of the AND gate, wherein an output of the AND gate 182 provides for an internal clock signal, and wherein the output of the AND gate 182 is coupled to an input of the array-tracking timing delay.

10. The memory bypass circuit of claim 1 wherein the write data input circuit comprises:
a first XNOR gate having inputs for a data input, a bit-write signal, and a logic test signal,
a second XNOR gate having inputs for the data input, the bit-write signal, and the logic test signal,
a first latch, and
a second latch,
wherein the second XNOR gate is configured to provide a complementary output signal to an output of the first XNOR gate,
wherein an input of the first latch is coupled to the output of the first XNOR gate for generating a data signal D_T, and
wherein an input of the second latch is coupled to the output of the second XNOR gate for generating a complementary data signal D_C.

11. The memory bypass circuit of claim 10 wherein clock inputs of the first latch and the second latch are coupled to the read and write activation circuit for receiving a write signal.

12. A method for providing a write through function for a memory device, comprising:
disabling word line activation;
concurrently activating read and write functions of the memory device;
generating an internal clock signal for the concurrently activated read and write functions; and
providing known data to the memory device for writing to bit lines of the memory device during a testing mode.

13. The method of claim 12 wherein the word line activation disabling is based on a logic test signal, an address of a word line for disabling, and an internal clock signal.

14. The method of claim 12 wherein the read and write functions are concurrently activated based on a logic test, a read/write enable signal to indicate a normal function call, and an internal clock signal.

15. The method of claim 12 wherein the internal clock signal generation is based on the logic test signal, a chip enable signal, and a clock signal for the memory device.

16. The method of claim 12 wherein the provided known data, a bit-write signal, and a logic test signal are gated by at least one XNOR gate to generate a data signal to be written to the bit lines of the memory device.

17. A memory system, the system comprising:
a memory; and
a memory bypass circuit, wherein the memory bypass circuit comprises:
a word line disable circuit;
a read and write activation circuit;
a internal clock generator; and
a write data input circuit, wherein the word line disable circuit is coupled to a word line of the memory device,
wherein the read and write activation circuit is coupled to the memory device for concurrent activation of writing and reading functions of the memory device during a testing mode,
wherein the internal clock generator is coupled to the word line disable circuit and the read/write activation circuit, and
wherein the write data input circuit is coupled to a write driver of the memory device for providing test data.

18. The memory system of claim 17 wherein the word line disable circuit comprises:
a latch,
an inverter,
a first AND gate for generating a word line deactivation signal A_C, and
a second AND gate for generating a word line deactivation signal A_T,
wherein inputs of the first AND gate are coupled to an output of the inverter, a negated logic test signal, and an internal clock signal,
wherein inputs of the second AND gate are coupled to the negated logic test signal, the internal clock signal, and an output of the latch,
wherein an input of the latch is coupled to an address input,
wherein a clock input of the latch is coupled to an inverse of the internal clock signal, and
wherein the word line deactivation signal A_C and the word line deactivation signal A_T are complimentary signals.

19. The memory system of claim 17 wherein the read and write activation circuit comprises:
a latch,
an inverter,
a first NAND gate,
a second NAND gate,
a first OR gate for generating a write command signal, and
a second OR gate for generating a read command signal,
wherein a first input of the first OR gate is coupled to the logic test signal and a second input of the first OR gate is coupled to an output of the first NAND gate,
wherein a first input of the second OR gate is coupled to the logic test signal and a second input of the second OR gate is coupled to an output of the second NAND gate,
wherein the latch, the inverter, and the first NAND gate are serially connected for generating a signal indicative of a normal write command, and
wherein the latch and the second NAND gate are serially connected for generating a signal indicative of a normal read command.

20. The memory system of claim 17 wherein the internal clock generator comprises an OR gate, an AND gate, and an array-tracking timing delay, wherein a logic test signal and a negated chip enable signal are coupled to the OR gate, wherein an output of the of the OR gate, a clock signal, and an output of the array-tracking timing delay are coupled to inputs of the AND gate, wherein an output of the AND gate 182 provides for an internal clock signal, and wherein the output of the AND gate 182 is coupled to an input of the array-tracking timing delay.

21. The memory system of claim 17 wherein the write data input circuit comprises:
a first XNOR gate having inputs for a data input, a bit-write signal, and a logic test signal, a second XNOR gate having inputs for the data input, the bit-write signal, and the logic test signal, a first latch, and a second latch, wherein the second XNOR gate is configured to provide a complementary output signal to an output of the first XNOR gate, wherein an input of the first latch is coupled to the output of the first XNOR gate for generating a data signal D_T, wherein an input of the second latch is coupled to the output of the second XNOR gate for generating a complementary data signal D_C, and wherein clock inputs of the first latch and the second latch are coupled to the read and write activation circuit for receiving a write signal.

* * * * *